(12) United States Patent
Yamazaki et al.

(10) Patent No.: US 8,120,921 B2
(45) Date of Patent: Feb. 21, 2012

(54) DEVICE HAVING ELECTRONIC COMPONENTS MOUNTED THEREIN AND METHOD FOR MANUFACTURING SUCH DEVICE

(75) Inventors: Takao Yamazaki, Minato-ku (JP); Shinji Watanabe, Minato-ku (JP); Tomoo Murakami, Minato-ku (JP); Yuuki Fujimura, Minato-ku (JP); Ryoji Osu, Kakegawa (JP); Katsuhiko Suzuki, Kakegawa (JP); Shizuaki Masuda, Kakegawa (JP); Nobuyuki Sato, Kakegawa (JP); Kikuo Wada, Kakegawa (JP)

(73) Assignees: NEC Corporation, Tokyo (JP); NEC Access Technica, Ltd., Kakegawa (JP)

( * ) Notice: Subject to any disclaimer, the term of this patent is extended or adjusted under 35 U.S.C. 154(b) by 218 days.

(21) Appl. No.: 12/669,423

(22) PCT Filed: Jul. 18, 2008

(86) PCT No.: PCT/JP2008/063007
§ 371 (c)(1),
(2), (4) Date: Jan. 15, 2010

(87) PCT Pub. No.: WO2009/011419
PCT Pub. Date: Jan. 22, 2009

(65) Prior Publication Data
US 2010/0188821 A1  Jul. 29, 2010

(30) Foreign Application Priority Data
Jul. 19, 2007  (JP) .................... 2007-188287

(51) Int. Cl.
*H05K 7/20* (2006.01)
*H01L 25/065* (2006.01)

(52) U.S. Cl. .... 361/720; 361/719; 361/749; 361/679.54; 257/774; 257/691; 257/E21.506; 438/109; 349/148; 349/149; 29/832

(58) Field of Classification Search ........................ None
See application file for complete search history.

(56) References Cited

U.S. PATENT DOCUMENTS

| | | | |
|---|---|---|---|
| 6,534,722 B2* | 3/2003 | Takaoka ................... | 174/254 |
| 6,576,992 B1 | 6/2003 | Cady et al. | |
| 6,657,620 B2* | 12/2003 | Oishi et al. .............. | 345/204 |
| 6,703,702 B2* | 3/2004 | Inoue et al. .............. | 257/684 |
| 7,374,967 B2* | 5/2008 | Lee .......................... | 438/109 |
| 7,414,851 B2* | 8/2008 | You .......................... | 361/719 |
| 7,932,969 B2* | 4/2011 | Hong ........................ | 349/69 |
| 2010/0148207 A1* | 6/2010 | Ryutani ..................... | 257/99 |

FOREIGN PATENT DOCUMENTS

JP   2000-088921 A   3/2000
(Continued)

*Primary Examiner* — Michail V Datskovskiy
(74) *Attorney, Agent, or Firm* — Sughrue Mion, PLLC

(57) ABSTRACT

A device having electronic components mounted therein has a first electronic component having an external terminal on a first surface and a heat spreader on a second surface, at least one second electronic component that is placed in the direction of a second surface of the first electronic component, a flexible circuit board that is electrically connected to the first electronic component and at least one second electronic component, and at least the part to which at least one second electronic component is connected is located on the second surface side of the first electronic component, and a spacer that is located between at least part of the flexible circuit board and the second surface of the first electronic component. The spacer can prevent heat from the first electronic component from being directly transferred to the second electronic component.

15 Claims, 22 Drawing Sheets

FOREIGN PATENT DOCUMENTS

| JP | 02001168268 A1 * | 6/2001 |
| JP | 2001-196504 A | 7/2001 |
| JP | 2005-203486 A | 7/2005 |
| JP | 2007-005607 A | 1/2007 |

* cited by examiner ued States Patent

DEVICE HAVING ELECTRONIC COMPONENTS MOUNTED THEREIN AND METHOD FOR MANUFACTURING SUCH DEVICE

CROSS REFERENCE TO RELATED APPLICATIONS

This application is a National Stage of International Application No. PCT/JP2008/063007, filed Jul. 18, 2008, which claims priority from Japanese Patent Application No. 2007-188287, filed Jul. 19, 2007, the contents of all of which are incorporated herein by reference in their entirety.

TECHNICAL FIELD

The present invention relates to a device having electronic components mounted therein, and more particularly to a device having a plurality of electronic components that are mounted 3-dimensionally therein, and to the manufacturing method thereof.

BACKGROUND ART

As electronic devices become more compact and multi-functional, and from the necessity of high-density mounting of electronic components, 3-dimensional mounting technology for mounting electronic components such as semiconductor devices in the stacking direction is being developed.

FIG. 21 shows a schematic cross-section view of a 3-dimensionally mounted semiconductor device of patent document 1. For example, in the 3-dimensionally mounted semiconductor device 121 disclosed in patent document 1, a second semiconductor device 114 is stacked on top of a first semiconductor device 112. Solder balls 118 that are formed on a first surface of the first semiconductor device 112 are electrically connected with a first flexible circuit board 113a and a second flexible circuit board 113b, where the first flexible circuit board 113a and second flexible circuit board 113b are bent along the first semiconductor device 112, and adhered to a second surface of the first semiconductor device 112. The second semiconductor device 114 is electrically connected to the first flexible circuit board 113a and second flexible circuit board 113b on the second surface of the first semiconductor device 112 via solder balls 119 on the first surface.

FIG. 22 shows a schematic cross-section view of a 3-dimensional semiconductor device of patent document 2. In the 3-dimensional semiconductor device 131 disclosed in patent document 2, a plurality of semiconductor package elements 132 are stacked and connected in multi stages. Each semiconductor package element 132 comprises a semiconductor device 133; a lead frame 135 that is connected to the semiconductor device 133 and that is made from a metallic foil that is bent in a right angle toward the side from the upper part of the semiconductor device; bumps 137 and pads 138 that connect the semiconductor device 133 and lead frame 135; an inner thermoplastic resin 134 that is provided between the inside of the lead frame 135 and the semiconductor device 133; and an outer thermoplastic resin 136 that is provided on the outside of the lead frame 135, with the lead frame 135 being exposed by forming opening sections 139 for the multi-stage connection being on both end sections on the upper surface of the outer thermoplastic resin 136. In the stacked structure, the edge surface of the lead frame 135 of the upper semiconductor package element 132 is connected to the exposed section of the lead frame 135 of the lower semiconductor package element 132 by using an electrical connecting material 140 that is coated on the opening section 139.

[Patent Document 1] U.S. Pat. No. 6,576,992
[Patent Document 2] Japanese Patent Kokai Publication No. JP-P2001-196504A

SUMMARY

The entire disclosures of Patent Documents 1 and 2 are incorporated herein by reference thereto. An analysis of related technology according to the present invention is given below.

The analysis below is given from the aspects of the present invention.

In the case where the semiconductor device is a high-temperature device that generates a large amount of heat such as a CPU (Central Processing Unit) that operates at high speed, normally a heat spreader is provided at the top of the semiconductor package, and the temperature of the surface of the heat spreader and surrounding area thereof is typically a high temperature of 80° C. or greater. Therefore, in 3-dimensionally mounted semiconductor devices such as disclosed in patent document 1 and patent document 2, when a high-temperature device is used as the lower-stage semiconductor device, a semiconductor device that is mounted above that high-temperature device via a flexible circuit board is placed above the heat spreader or near the heat spreader. As a result, the upper-stage semiconductor device is naturally in a state of being heated to a high temperature. When the upper-stage semiconductor device is a semiconductor device such as a memory, the rated operating temperature of a memory is generally 80° C. or less, so there is a possibility that the device will malfunction due to the high-temperature environment.

The object of the present invention is to provide a device having electronic components mounted therein and a manufacturing method thereof wherein electronic components that generate a large amount of heat and electronic components that have a high necessity of being thermally protected can be stacked.

According to a first aspect of the present invention, there is provided a device having electronic components mounted therein. The device has a first electronic component having an external terminal on a first surface and a heat spreader on a second surface and at least one second electronic component that is located in the direction of the second surface of the first electronic component. The device has a flexible circuit board that is electrically connected to the external terminal of the first electronic component and at least one second electronic component. At least the part of the flexible circuit board to which at least one second electronic component is connected is located on the second surface side of the first electronic component. The device has a spacer that prevents direct heat transfer between at least part of the flexible circuit board and the second surface of the first electronic component.

According to a second aspect of the present invention, there is provided a manufacturing method for a device having electronic components mounted therein. The method has installing a spacer on a second surface of a first electronic component. The first electronic component has an external terminal on a first surface and a heat spreader on a second surface. The spacer prevents direct heat transfer between at least a part of a flexible circuit board that is located above the second surface and the second surface. The method has electrically connecting the external terminals and the flexible circuit board, bending the flexible circuit board such that part of the flexible circuit board is located above the spacer, and electrically connecting the second electronic component to the portion of the flexible circuit board that is above the spacer.

According to a third aspect of the present invention, there is provided a manufacturing method for a device having electronic components mounted therein. The method has installing a spacer on a second surface of a first electronic component. The first electronic component has an external terminal on a first surface and a heat spreader on a second surface. The spacer prevents direct heat transfer between at least a part of a flexible circuit board that is located above the second surface and the second surface. The method has electrically connecting the external terminals and the flexible circuit board, electrically connecting the second electronic component and the flexible circuit board, and bending the flexible circuit board such that the electronic component is located above the spacer.

In the present invention, the term 'direct heat transfer' means heat transfer through direct contact and heat transfer via a conducting body.

In the present invention, there is a spacer located between a first electronic component and a second electronic component that is installed above the first electronic component. By doing so, direct heat transfer from the first electronic component to the second electronic component can be prevented even when the first electronic component generates a large amount of heat, so it is possible to protect the second electronic component from heat.

PREFERRED MODES

Figure 1:
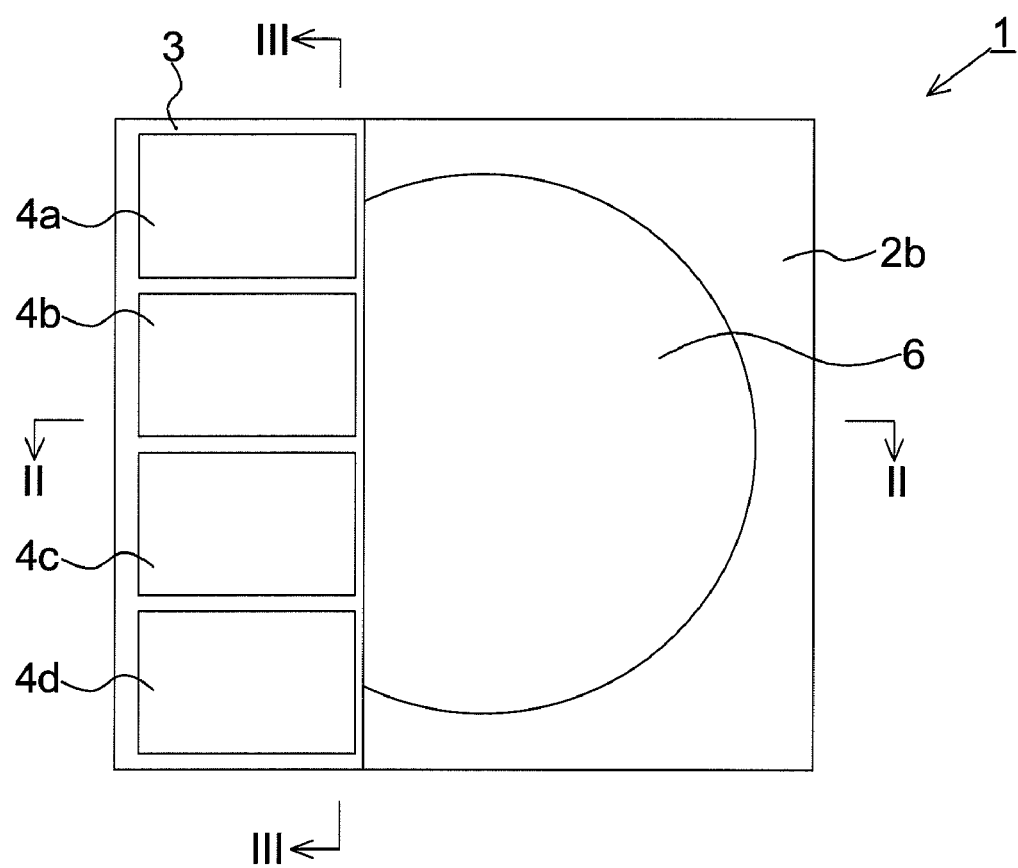
FIG. 1 is a schematic top view of a device having electronic components mounted therein of a first exemplary embodiment of the present invention.

In a preferred mode in the first aspect of the invention described above, a spacer provides a specified space between at least part of a flexible circuit board and a second surface of a first electronic component.

In a preferred mode in the first aspect of the invention described above, the spacer is secured to a portion of the second surface of the first electronic component other than a heat spreader surface.

In a preferred mode in the first aspect of the invention described above, a portion of the spacer on which at least one second electronic component is installed extends though a specified space between the portion of the spacer and the heat spreader so that the portion of the spacer does not come in contact with the heat spreader.

In a preferred mode in the first aspect of the invention described above, the spacer is shaped such that, in an area other than the area where a heat sink is mounted on the heat spreader, the spacer covers the second surface of the first electronic component. The spacer and first electronic component form an opening for allowing air in the space to circulate.

In a preferred mode in the first aspect of the invention described above, the spacer is formed in at least one of glass, resin and ceramic.

In a preferred mode in the first aspect of the invention described above, the thermal conductivity coefficient is 1 W/mK or less.

In a preferred mode in the first aspect of the invention described above, the first electronic component and second electronic component are connected to different surfaces of a flexible circuit board.

In a preferred mode in the first aspect of the invention described above, the spacer has a concave section or groove section. At least one second electronic component is housed in the concave section or groove section.

In a preferred mode in the first aspect of the invention described above, at least one second electronic component does not come in contact with the spacer.

In a preferred mode in the first aspect of the invention described above, the first electronic component and second electronic components are connected to the same surface of the flexible circuit board.

In a preferred mode in the first aspect of the invention described above, the first electronic component is an electronic component that includes a semiconductor element. At least one second electronic component is an electronic component that includes a semiconductor element or passive component.

In a preferred mode in the first aspect of the invention described above, the flexible circuit board is adhered to at least the first electronic component or spacer by an adhesive. The adhesive is a thermoplastic resin, or thermo-setting resin before hardening.

With the present invention, by further providing a space between the spacer and heat spreader of the first electronic component, both the first electronic component and second electronic components can be further cooled by air cooling.

Moreover, by installing the device having electronic components mounted therein of the present invention on a mother board (circuit board) or module board, the mounting surface area of the electronic components can be reduced, and the connection distance between parts can be shortened, and thus the electronic equipment in which these boards are installed can be made more compact and have higher performance. Therefore, with the present invention, a compact and high-performance device having electronic components mounted therein is possible.

Figure 2:
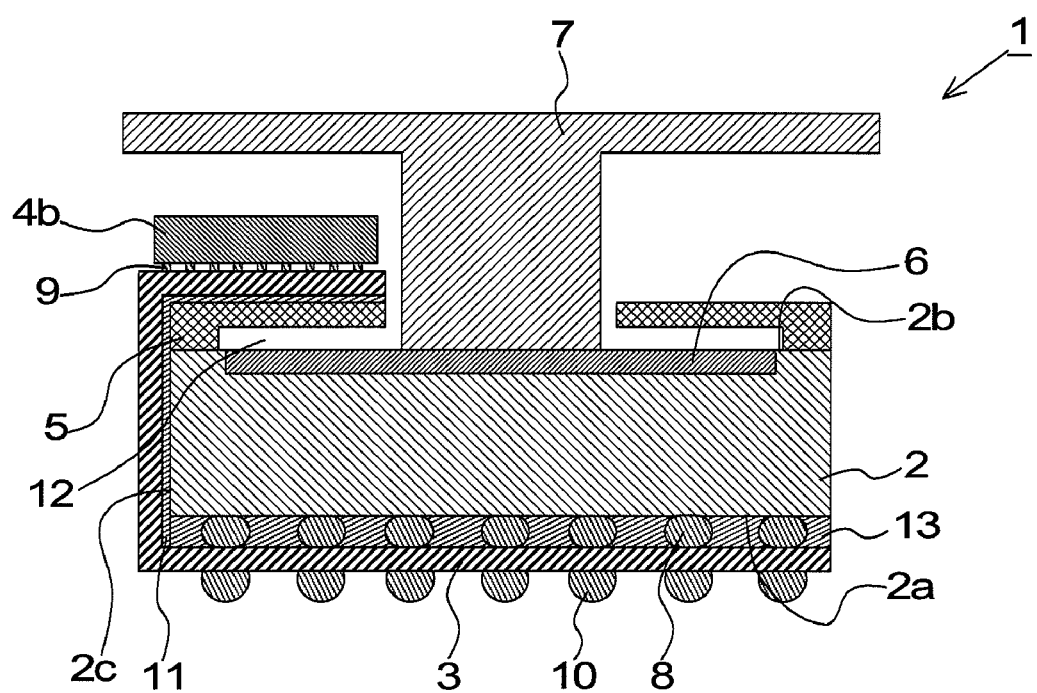
FIG. 2 is a schematic cross-sectional view along section line II-II of the device having electronic components mounted therein shown in FIG. 1.
Figure 3:
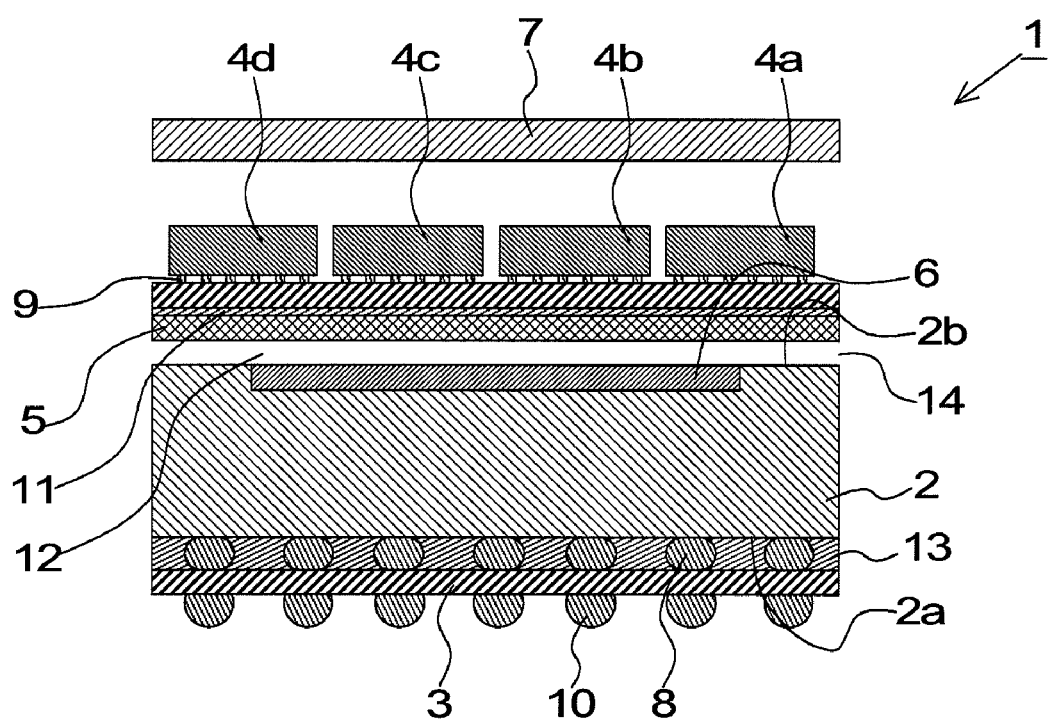
FIG. 3 is a schematic cross-sectional view along section line III-III of the device having electronic components mounted therein shown in FIG. 1.

A device having electronic components mounted therein of a first embodiment of the present invention will be explained. FIG. 1 is a schematic top view of a device having electronic components mounted therein of a first exemplary embodiment of the present invention (however, the heat sink and spacer have been omitted in the drawing); FIG. 2 is a schematic cross-section view along section line II-II of the device having electronic components mounted therein shown in FIG. 1; and FIG. 3 is a schematic cross-section view along section line III-III of the device having electronic components mounted therein shown in FIG. 1. The device 1 having electronic components mounted therein comprises: a first electronic component 2, a flexible circuit board 3, second electronic components 4, a heat sink 7 and spacer 5. The first electronic component 2 comprises external terminals (not shown in the figure) on a first surface (an active surface, for example, an electrical connection surface such as a surface having solder balls, a surface having circuits and the like) 2a, and a heat spreader (heat radiating plate) 6 on a second surface 2b on the opposite side of the first surface 2a. In FIG. 2 and FIG. 3, the heat spreader 6 is embedded in the first electronic component 2 such that it forms a flat surface with the second surface 2b of the first electronic component 2, however, there is no problem if the second surface 2b of the first electronic component 2 becomes uneven due to the heat spreader 6. In addition, it is preferred that the heat spreader 6 be thermally connected to a heat source of the first electronic component 2. For example, in the case where the first electronic components 2 is a semiconductor device such as a CPU, it is preferred that the heat spreader 6 is thermally connected to the semiconductor element inside the first electronic component 2.

The flexible circuit board 3 is electrically connected by external terminals (not shown in the figure) to external terminals (not shown in the figure) of the first surface 2a of the first electronic component 2 via solder balls 8. Also, the flexible circuit board 3 is electrically connected by external terminals (not shown in the figure) to the external terminals (not shown in the figure) of the second electronic components 4a to 4d via solder balls 9. The flexible circuit board 3 bends from the side surface 2c of the first electronic component 1 toward the second surface 2b so that the portion of the flexible circuit board 3 to which the second electronic components 4a to 4d are connected is located on the second surface 2b side of the first electronic component 1. In FIG. 1, four second electronic components 4a to 4d are shown, however, the number of second electronic components is not limited to four and can be suitably set as necessary or according to the mounting surface area.

A spacer 5 is provided on top of the second surface 2b of the first electronic component 2, and the flexible circuit board 3 bends around the spacer 5. The spacer 5 is located between the second surface 2b of the first electronic component 2 and the flexible circuit board 3 so that the flexible circuit boar 3 does not come in contact with the heat spreader 6. The second electronic components 4a to 4d are arranged on the spacer 5 via the flexible circuit board 3 and are supported by the spacer 5.

The first electronic component 2 and the second electronic components 4a to 4d are mounted on different surfaces of the flexible circuit board 3, and by locating the second electronic components 4a to 4d on the second surface 2b of the first electronic component 2 by bending the flexible circuit board 3, the first electronic component 2 and second electronic components 4a to 4d are mounted such that the surfaces of the external terminals (surface on which solder balls are formed) are oriented in the same direction.

The spacer 5 is preferably placed such that it does not come in contact with the heat spreader 6 and heat sink 7 in order that heat from the first electronic component 2 is not transferred to the second electronic components 4a to 4d. Therefore, the spacer 5 is preferably secured to a portion on the second surface 2b of the first electronic component 2 other than the surface of the heat spreader 6. Moreover, as shown in FIG. 1, the spacer 5 is preferably formed such it has an L-shaped cross section and such that the portion that supports the second electronic components 4a to 4d extends through a specified space 12 between the heat spreader 6 and the portion. By doing this, a space 12 and the spacer 5 are located between the heat spreader 6 and flexible circuit board 3, and this makes it possible to suppress heat transfer from the first electronic component 2 to the second electronic components 4a to 4d by way of the spacer 5, as well as makes it possible to increase the cooling efficiency of the first electronic component 2 and second electronic components 4a to 4d by the air-cooling action of the space 12. Heat transfer becomes more difficult the thicker the thickness of the spacer 5 is, therefore, the thickness of the spacer 5 is preferably made as thick as possible within a range such that the overall size of the device 1 having electronic components mounted therein does not become a problem. In addition, heat transfer becomes more difficult and the air-cooling action of the space 12 is increased the greater the size of the space 12 between the spacer 5 and the heat spreader 6 is, so preferably the size of the space 12 is made as large as possible within a range that the overall size of the device 1 having electronic components mounted therein does not become a problem.

The spacer 5 is preferably formed from a material other than metal, and more preferably is formed from an insulating material. A material that has a low thermal conductivity, as well as a material whose properties do not change during the manufacturing process or under reflow process conditions (for example, a maximum temperature of 220° C. to 260° C. for 60 seconds) is preferred for use as the spacer 5. It is possible to use a material such as resin, glass, ceramic and the like as the spacer 5 material. The thermal conductivity of the spacer 5 is more preferably 1 W/mK or less. Also, the spacer has enough strength as to be able to support the second electronic components 4a to 4d.

In the present invention, the thermal conductivity of the spacer 5 is measured using the laser flash method. That method complies with the JIS standard. For example, in the case where the material of the spacer 5 is a fine ceramic, the thermal conductivity is measured according to JISR1611.

Figure 4:
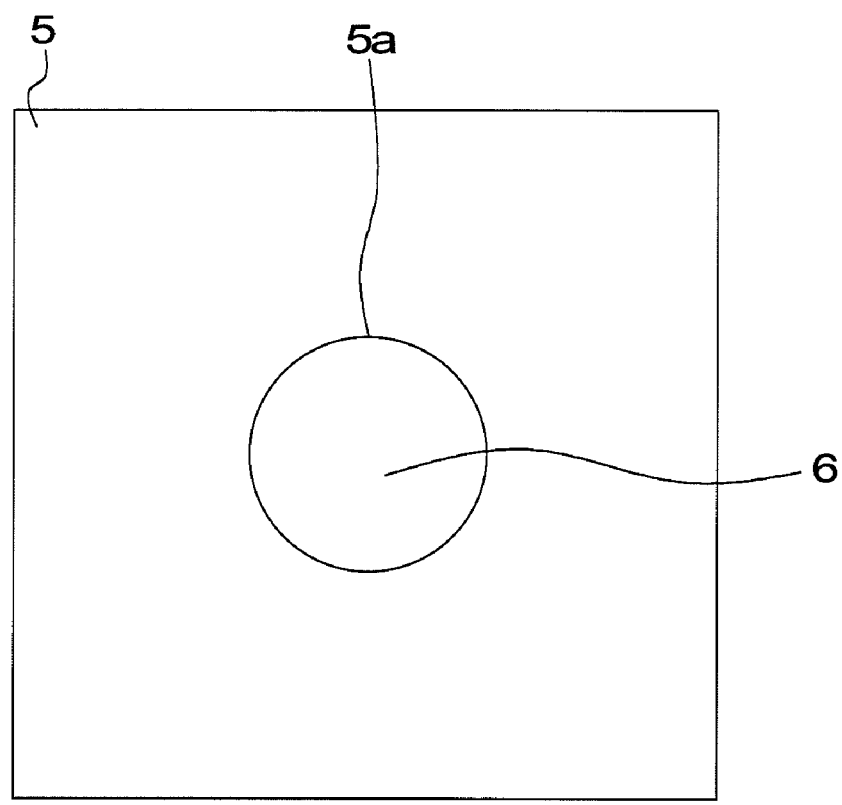
FIG. 4 is a schematic top plan view of a device having electronic components mounted therein showing an example of the shape of a spacer.
Figure 5:
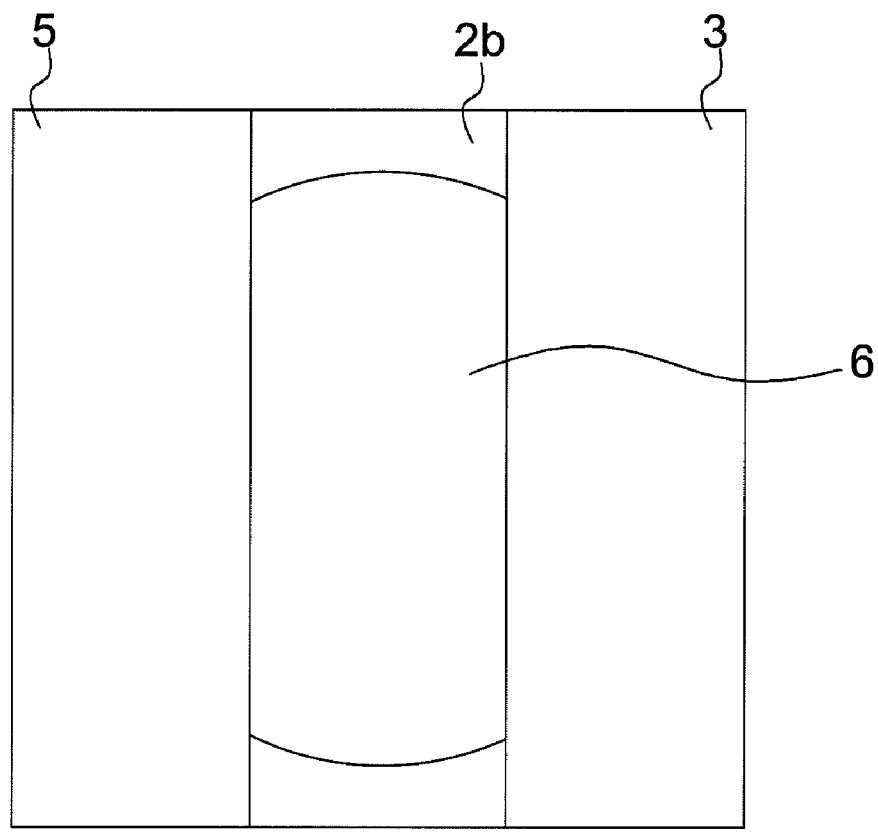
FIG. 5 is a schematic top plan view of a device having electronic components mounted therein showing an example of the shape of a spacer.

The shape of the spacer 5 can be any shape that is capable of maintaining the mounted position of the second electronic components on the first electronic component 2, and can be set to various suitable shapes according to the size and number of second electronic components to be mounted. FIG. 4 and FIG. 5 show schematic top views of the device having electronic components mounted therein and show examples of the shape of the spacer (however, the flexible circuit board, second electronic components and heat sink are omitted in the figures).

In the example shown in FIG. 4, the spacer 5 is formed so that it covers the area on the second surface 2b of the first electronic component 2 other than the area where the heat sink 7 is located. In other words, an opening 5a for mounting the heat sink 7 is formed on the surface where the second electronic components 4a to 4d will be mounted, and in the top view as shown in FIG. 4, part of the heat spreader 6 is exposed. When doing this, the spacer 5 is preferably secured to the portion of the second surface 2b of the first electronic component 2 other than where the heat spreader 6 is located. Moreover, a spacer 5 whose top surface is shaped as shown in FIG. 4 is preferably shaped such that air inside the space 12 circulates. For example, as shown in FIG. 2 and FIG. 3 it is possible to form a spacer 5 having an inverted groove shape (U-shaped cross section) such as will form an opening 14 on opposing side surfaces between the spacer 5 and the first electronic component 2. With this kind of shape, air inside the space 12 passes through the openings 14 on the side surfaces and circulates (for example, in the cross-section view of FIG. 3, the air inside the space 12 is made to circulated to the left and right) making it possible to increase the cooling efficiency.

Furthermore, in the example shown in FIG. 5, the spacer 5 is formed from a plurality of components; for example, the spacer can be formed only in necessary areas such as only in the portion where the flexible circuit board 3 bends back over the top of the second surface 2b of the first electronic component 2, only in the portion where the second electronic components 4a to 4d are stacked on the second surface 2b of the first electronic component 2, and the like. Also, in the example shown in FIG. 5, the spacer 5 is preferably secured to the area on the second surface 2b of the first electronic component 2 other than where the heater spreader 6 is located. Moreover, the shape of the spacer 5 is preferably set so that the surface area projected onto the top surface as shown in FIG. 4 of FIG. 5 is as large as possible.

The spacer 5 is preferably secured to the second surface 2b of the first electronic component 2 by an adhesive (not shown in the figure). Any adhesive is preferably an insulating adhesive having low thermal conductivity and heat resistance. In addition, the flexible circuit board 3 is preferably secured to the first electronic component 2 and spacer 5 by an adhesive 11. A liquid type adhesive or sheet type adhesive can be used as the adhesive 11. When a thermo-setting resin sheet in a state before thermosetting (for example, an epoxy type resin) is used as the adhesive 11, it is possible to reduce the variation (fluctuation) in the thickness as compared to when a liquid type adhesive is used, and thus the surface of the flexible circuit board 3 where the second electronic components 4a to 4d are placed can be made flatter. Also, by using a thermoplastic resin sheet (for example, a compound material of a modified polyimide and epoxy resin) as the adhesive 11, not only is fluctuation in the thickness of the adhesive 11 improved, but there is no need for a thermosetting process (curing) for the adhesive 11, so the adhering time during the manufacturing process can be shortened (for example, what used to require 60 minutes, is shortened to 10 seconds or less), and thus the processing cost can be reduced and the amount of time of applying heat to the first electronic component 2 can be shortened.

Underfill resin 13 is filled in between the first surface 2a of the first electronic component 2 and the flexible circuit board 3. In order to increase the thermal conductivity, it is preferred that a filler having a high thermal conductivity be included in the underfill resin 13. For example, the thermal conductivity of the underfill resin 13 is preferably 3 W/mK or greater. By increasing the thermal conductivity of the underfill resin 13, the heat of the first electronic component 2 is not only released from the second surface 2b (heat spreader 6) side, but can also be released from the first surface 2a side through the external terminals. By doing so, it is possible to further reduce the ambient temperature of the second electronic components 4a to 4d.

It is preferable that a ceramic is used as the filler that is included in the underfill resin 13; for example, silica, alumina, boron nitride, magnesia, aluminum nitride, silicon nitride and the like can be used. The percentage of a content of filler contained in the filler-containing underfill resin 13 is preferably 40 weight % to 90 weight %, the thermal conductivity thereof is preferably 0.5 W/mK to 3 W/mK. The shape and dimensions of the filler are not especially limited, however, in the case of a spherical shape, for example, a filler having a diameter of 10 μm to 100 μm can be used.

The heat sink 7 is adhered to the exposed surface of the heat spreader 6 by an electrically conductive adhesive (not shown in the figure) for example.

Of the insulating materials of the flexible circuit board 3, at least one is preferably a thermoplastic resin. This is because that by using a thermoplastic resin, the coefficient of elasticity becomes very low due to the heat of the first electronic component 2 (for example, becomes several MPa to several tens of MPa), making it very easy for the flexible circuit board 3 to bend. When a device having electronic components that are 3-dimensionally mounted therein is used that comprises an electronic component having a large number of external terminals (for example, 500 pins or more) such as a CPU as the first electronic component 2 and other electronic components as the second electronic components, the flexible circuit board 3 must use a multi-layered circuit board having a number of wiring layers of at least 2 layers or more, however, as the number of wiring layer increases the thickness also increases, so bending the flexible circuit board 3 becomes difficult. Therefore, in order to make it easier to bend a multi-layered circuit board, it is preferred that a thermoplastic resin is used.

Moreover, of the insulating materials of the flexible circuit board 3, at least one may also be a thermo-setting resin in a state before hardening. Similar to a thermoplastic resin, the coefficient of elasticity of a thermo-setting resin in a state hardening (B stage) is also low (100 MPa or less), so the flexible circuit board can be made to be easily bendable.

Figure 6:
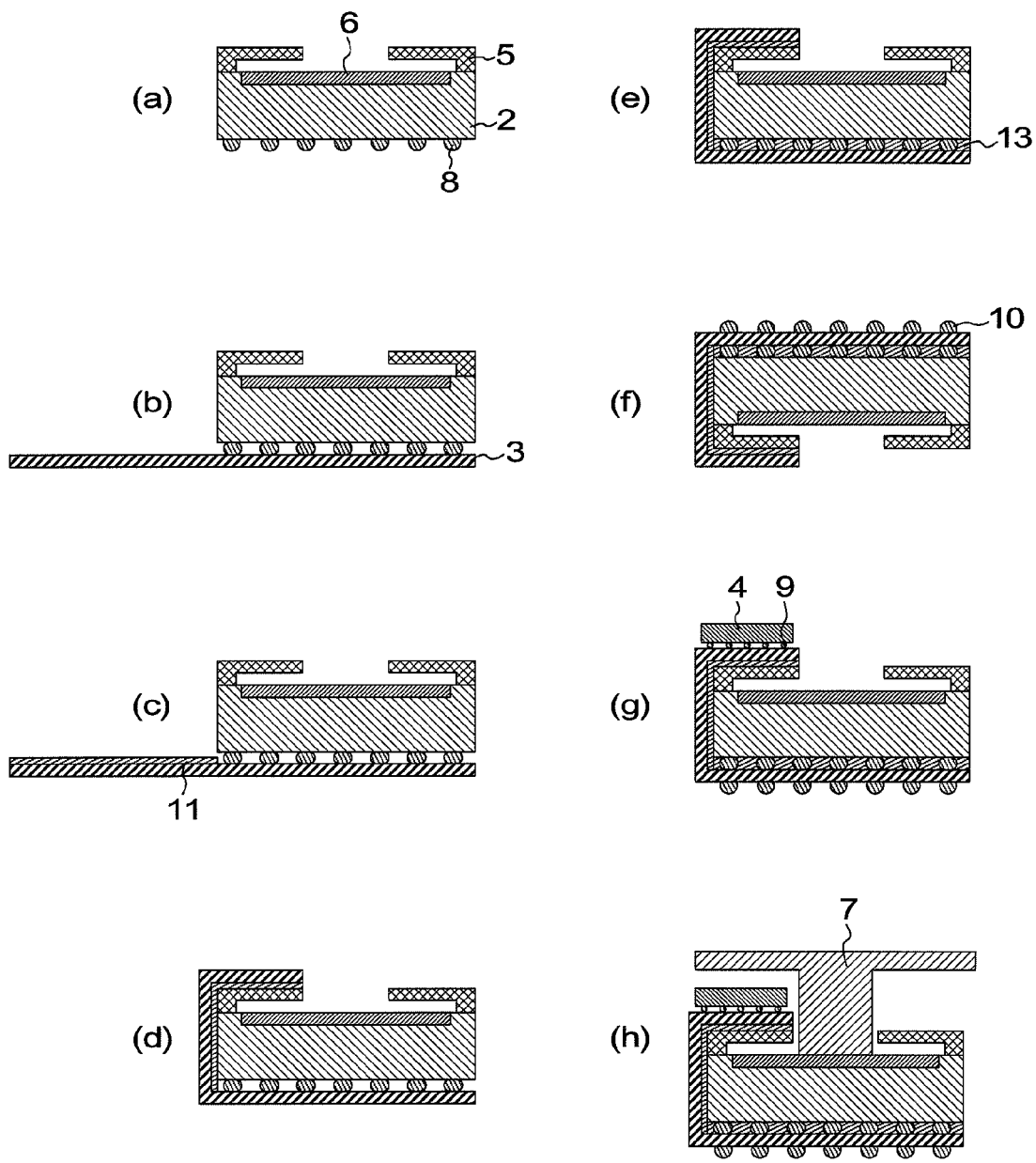
FIG. 6 is a process diagram for explaining the method for manufacturing a device having electronic components mounted therein of a first exemplary embodiment of the present invention.

Next, the method of manufacturing the device having electronic components mounted therein of this first exemplary embodiment of the present invention will be explained. FIG. 6 is a process diagram for explaining the method of manufacturing the device having electronic components mounted therein of the present invention.

First, the spacer 5 is adhered to the surface of the heat spreader 6 side of the first electronic component 2 using an insulating adhesive (not shown in the figure) having low thermal conductivity and good heat resistance ((a) of FIG. 6). Next, the external terminals (not shown in the figure) of the flexible circuit board 3 on which wiring is formed and solder balls 8 that are formed on the first electronic component 2 are electrically connected using, for example, a reflow method ((b) of FIG. 6). Adhesive 11 is then applied to the flexible circuit board 3 in order to adhere the flexible circuit board 3 to the first electronic component 2 and spacer 5 ((c) of FIG. 6). Next, the flexible circuit board 3 is bent along the side surface of the first electronic component 2 and the surface of the spacer 5, and the flexible circuit board 3 is attached to the first electronic component 2 and spacer 5 ((d) of FIG. 6). Underfill resin 13 is then filled between the surface on which solder balls 8 are formed on the first electronic component 2 and the flexible circuit board 3 and thermally set ((e) of FIG. 6). Next, solder balls 10 are formed on the flexible circuit board 3 by reflow (see (f) of FIG. 6). Second electronic components 4 are placed on the surface of the flexible circuit board 3 above the spacer 5, and fused to the surface by reflow ((g) of FIG. 6). Finally, the heat sink 7 is adhered onto the heat spreader 6 using an electrically conductive adhesive (not shown in the figure) to complete the device having electronic components mounted therein ((h) of FIG. 6).

Figure 7:
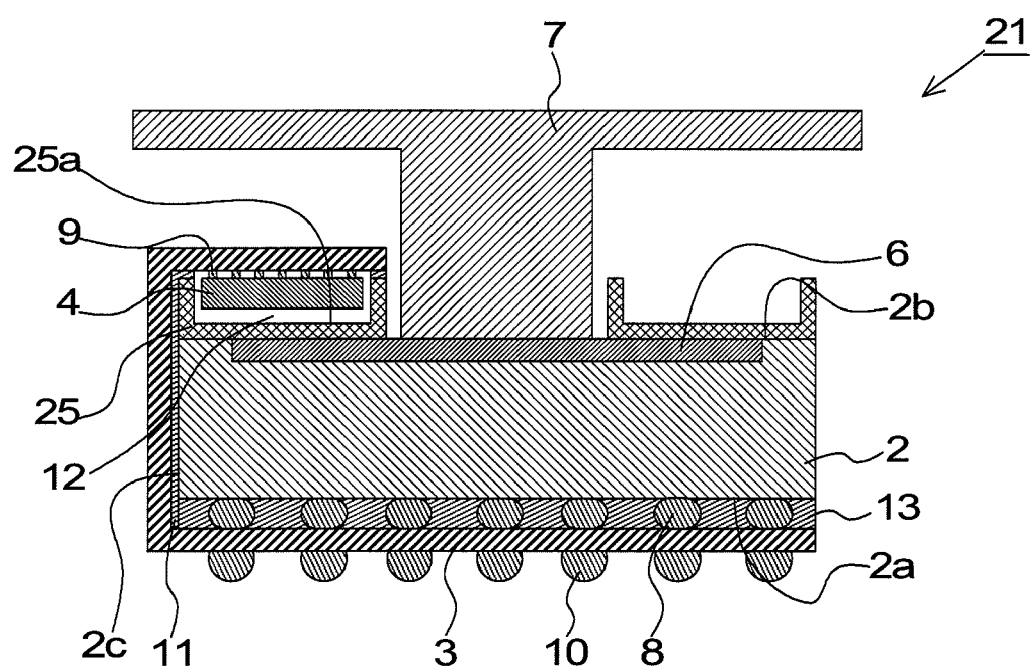
FIG. 7 is a schematic cross-sectional view of a device having electronic components mounted therein of a second exemplary embodiment of the present invention.

Next, a device having electronic components mounted therein of a second exemplary embodiment of the present invention will be explained. FIG. 7 shows a schematic top view of a device having electronic components mounted therein of a second exemplary embodiment of the invention. In FIG. 7 the same reference numbers are given to elements that are the same as the elements shown in FIG. 1 to FIG. 3. In the first exemplary embodiment, the first electronic component 2 and second electronic components 4 were mounted on different surfaces of the flexible circuit board 3, however, in a second exemplary embodiment, the first electronic component 2 and second electronic components 4 are mounted on the same surface of the flexible circuit board 3.

In order to do this, the mode of the spacer 25 of this second exemplary embodiment is different than the mode of the spacer of the first exemplary embodiment. Together with being able to accommodate the second electronic components 4, the spacer 25 has a concave section or groove section 25a that is capable of supporting the flexible circuit board 3. The spacer 25 may have an overall groove shape (U-shape or concave shape), or may be formed such that only the portion that accommodates the second electronic components 4 has a concave shape. The concave section or groove section 25a of the spacer 25 is preferably constructed such that even though it may cover the flexible circuit board 3, it does not close off the space so that air circulates with the outside. This makes it possible to increase the cooling efficiency.

The flexible circuit board 3 is bent from the first surface 2a of the first electronic component 2 along the first electronic component 2 and spacer 25 toward the second surface 2b of the first electronic component 2. The portion of the spacer 25 other than the concave section or groove section 25a supports the flexible circuit board 3, and the flexible circuit board 3 and spacer 25 form a space that accommodates the second electronic components 4. The second electronic components 4 are accommodated inside the concave section or groove section 25a of the spacer 25, and are surrounded by the spacer 25 and flexible circuit board 3. The second electronic components 4 are placed such that the surface on which solder balls 9 are formed faces the side opposite from the first electronic component 2. A space 12 is formed between the second electronic components 4 and the spacer 25 so that the second electronic components 4 do not come in contact with the spacer 25. By doing this, heat from the first electronic component 2 can be prevented from being transferred by way of the spacer 25, and the heat radiation effect can be improved.

Figure 8:
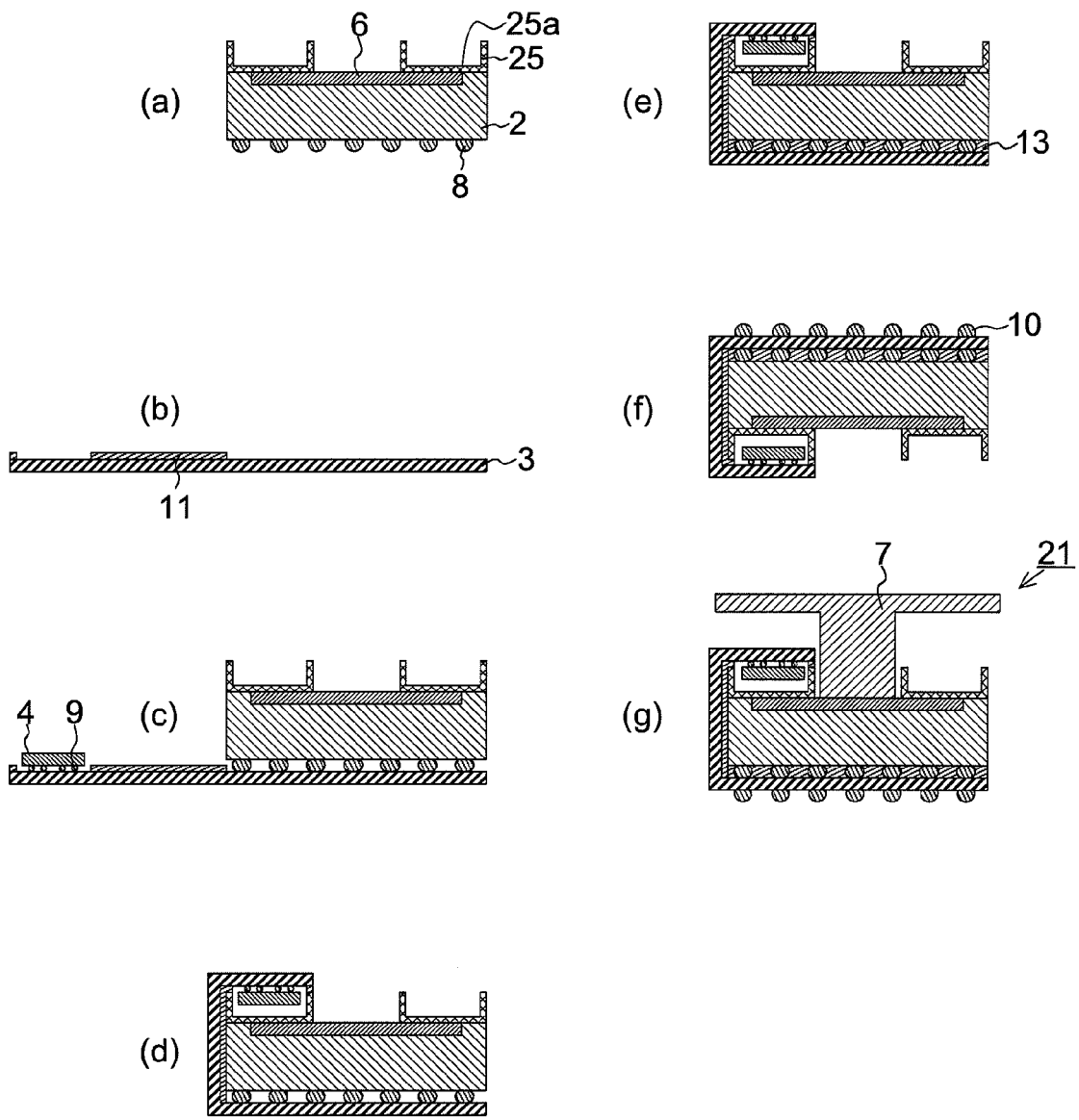
FIG. 8 is a process diagram for explaining the method for manufacturing a device having electronic components mounted therein of a second exemplary embodiment of the present invention.

Next, the method for manufacturing the device having electronic components mounted therein of this second exemplary embodiment of the present invention will be explained. FIG. 8 is a process diagram for explaining the method for manufacturing the device having electronic components mounted therein of this second exemplary embodiment of the present invention.

First, the spacer 25 that is formed with a concave section or groove section 25a is adhered to the first electronic component 2 ((a) of FIG. 8). Next, a sheet-type adhesive 11 (for example thermoplastic resin) is applied beforehand to a specified location on the flexible circuit board 3, or in other words, the location where the first electronic component 2 and spacer 25 are to be adhered ((b) of FIG. 8). The first electronic component 2 and second components 4 are then mounted on the same surface of the flexible circuit board 3 by reflow ((c) of FIG. 8). Then the flexible circuit board 3 is bent along the first electronic component 2 and spacer 25 so that the portion that is connected to the second electronic components 4 is located on the heat spreader 6 side of the first electronic component 2, and adhered to each surface ((d) of FIG. 8). When doing this, the second electronic components 4 are accommodated in the concave section of the spacer 25, however, are such that they do not come in contact with the spacer 25. Next, underfill resin 13 is filled in between the surface of the first electronic component 2 where solder balls 8 are formed and the flexible circuit board 3, and thermally set ((e) of FIG. 8). Solder balls 10 are then formed by reflow on the flexible circuit board on the surface on the opposite side from the surface where the first electronic component 2 is mounted ((f) of FIG. 8). Finally, the heat sink 7 is adhered to the heat spreader 6 using an electrically conductive adhesive (not shown in the figure) to complete the device having electronic components mounted therein ((g) of FIG. 8).

When compared with the manufacturing method of the first exemplary embodiment, the method for manufacturing a device having electronic components mounted therein of this second exemplary embodiment can reduce the reflow history by one time. Normally, a semiconductor device such as a CPU has a tendency for the characteristics to degrade due to the temperature history during reflow. Therefore, with this second exemplary embodiment, it is possible to improve the reliability of the electronic components.

Figure 9:
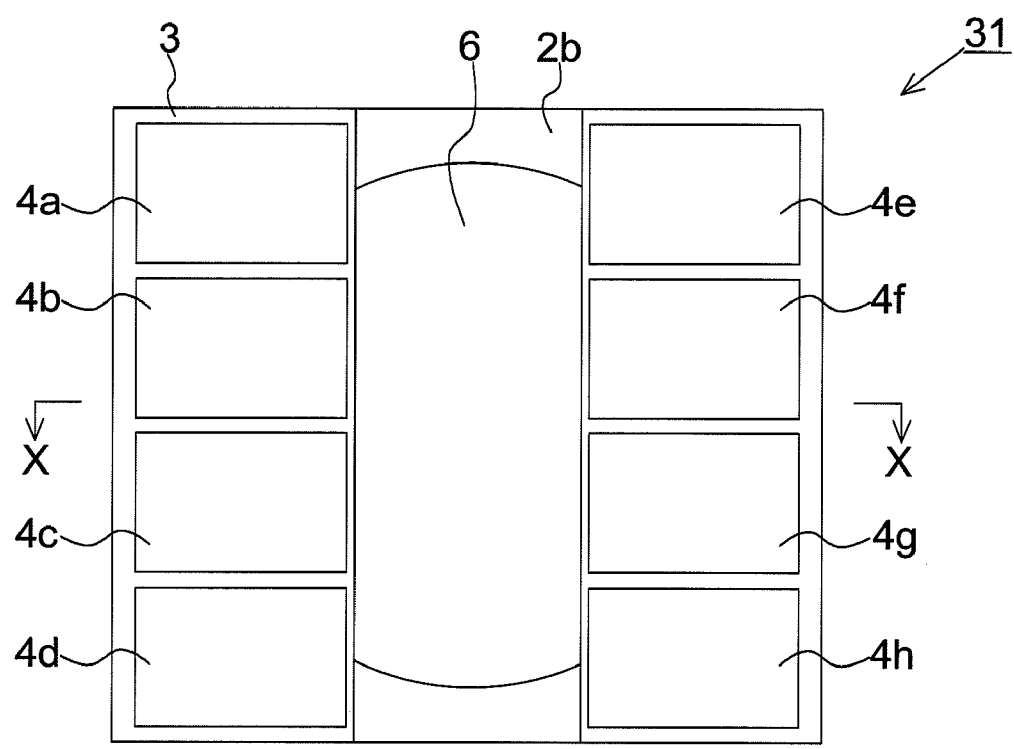
FIG. 9 is a schematic cross-sectional view of a device having electronic components mounted therein of a third exemplary embodiment of the present invention.
Figure 10:
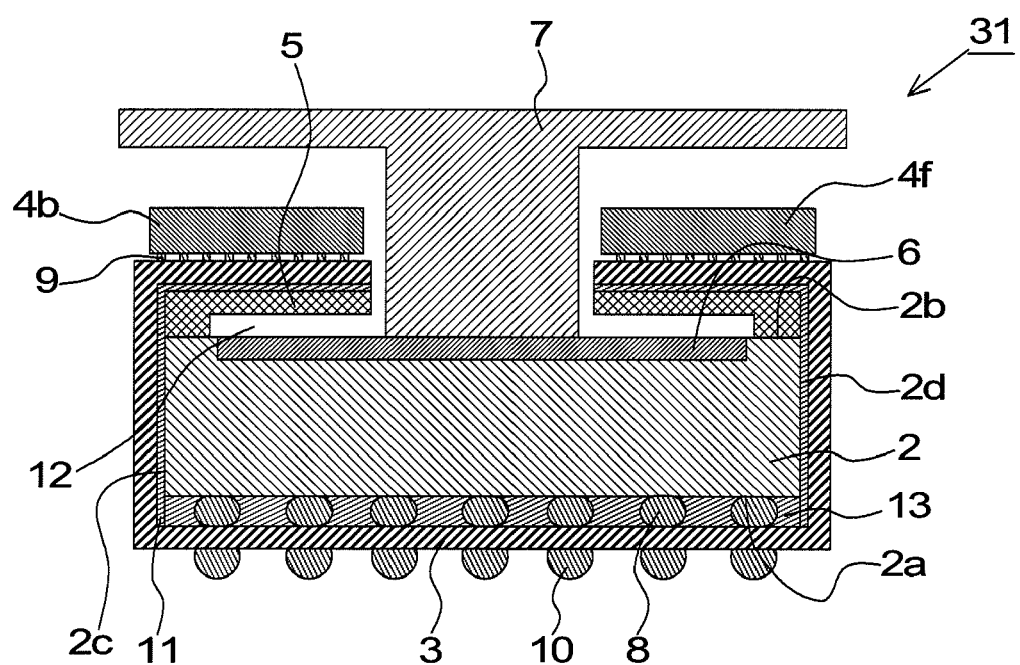
FIG. 10 is a schematic cross-sectional view along section line X-X of the device having electronic components mounted therein shown in FIG. 9.

Next, a device having electronic components mounted therein of a third exemplary embodiment of the preset invention will be explained. FIG. 9 is a schematic top view of a device having electronic components mounted therein of a third exemplary embodiment of the preset invention (however the heat sink and spacer are omitted from the drawing), and FIG. 10 is a cross-section view of the device having electronic components mounted therein of a third exemplary embodiment of the present invention along the section line X-X shown in FIG. 9. In FIG. 9 and FIG. 10, the same reference numbers are assigned to elements that are the same as those shown in FIG. 1 to FIG. 3. In the cross-section view shown in FIG. 2 of the first exemplary embodiment, the flexible circuit board 3 is bent along only one side surface 2c of the first electronic component 2, however, in a third exemplary embodiment shown in FIG. 9 and FIG. 10, not only is the flexible circuit board 3 bent from just a first side surface 2c, but is also bent from a second side surface 2d on the opposite side. When doing this, the shape of the spacer 5 can be any shape as long as it is capable of supporting the flexible circuit board 3 that is bent over the second surface 2b of the first electronic component 2 as in the mode shown in FIG. 4 and FIG. 5, for example. The second electronic components 4a to 4h are mounted on the portion of the flexible circuit board 3 that is bent over the second surface 2b of the first electronic component 2.

With this third exemplary embodiment, the stackable space for stacking the second electronic components above the first electronic component can be increased, making it possible to stack more second electronic components.

Figure 11:
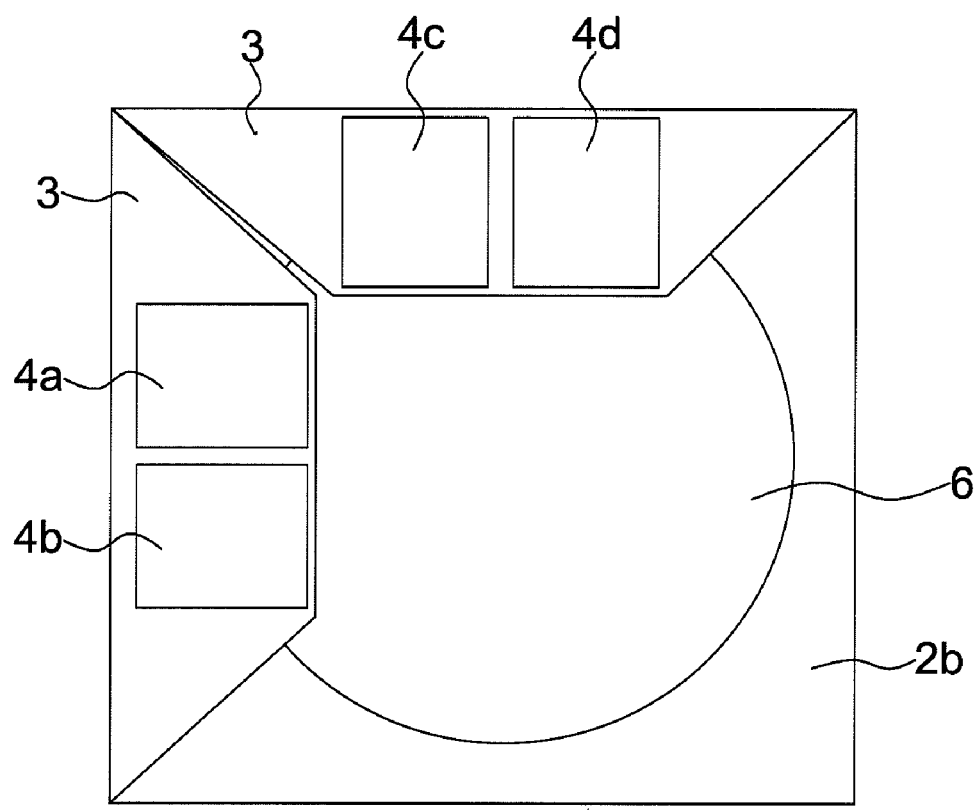
FIG. 11 is a schematic top plan view showing an example of a device having electronic components mounted therein of a third exemplary embodiment.
Figure 12:
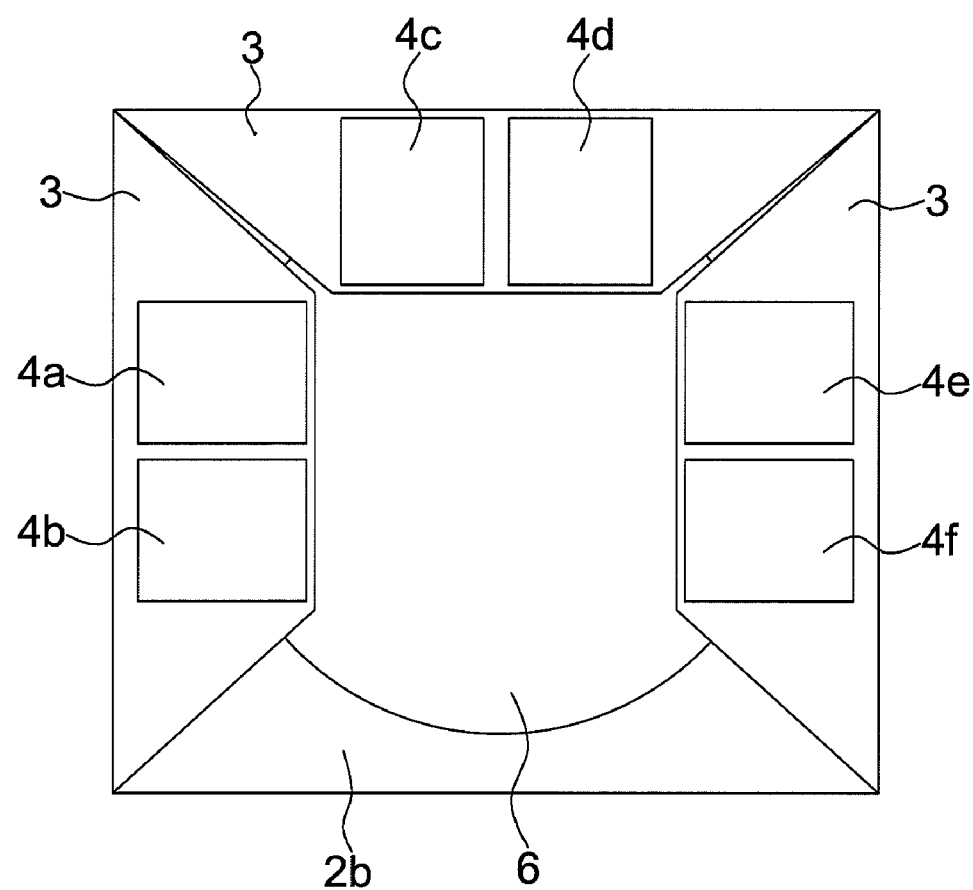
FIG. 12 is a schematic top plan view showing an example of a device having electronic components mounted therein of a third exemplary embodiment.
Figure 13:
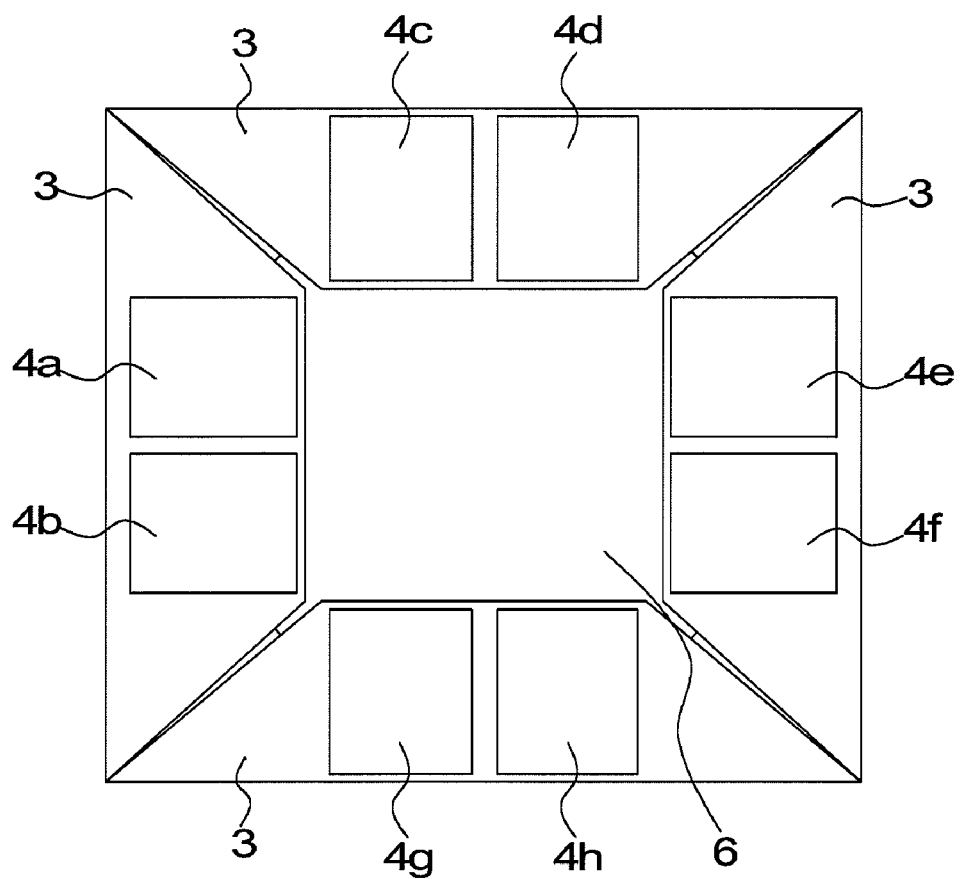
FIG. 13 is a schematic top plan view showing an example of a device having electronic components mounted therein of a third exemplary embodiment.

In each of the exemplary embodiments of the present invention, the bent mode of the flexible circuit board is not limited to the mode of FIG. 9, and various modes that take into consideration the existence of a heat sink 7 are possible. For example, bent modes as shown in FIG. 11 to FIG. 13 are possible as other bent modes for the flexible circuit board. In FIG. 11 to FIG. 13, the heat sink and spacer are omitted from the drawings. In the mode shown in FIG. 11, the flexible circuit board 3 is bent from two adjacent side surfaces to above the first surface 2a of the first electronic component 2; in the mode shown in FIG. 12, the flexible circuit board 3 is bent from three side surfaces to above the first surface 2a of the first electronic component 2; and in the mode shown in FIG. 13, the flexible circuit board 3 is bent from all side surfaces (four side surfaces) to above the first surface 2a of the first electronic component 2. The dimensions, shape and bent mode of the flexible circuit board 3 can be suitably set according to conditions such as the number, position, size and the like of the second electronic components 4 to be stacked above the first electronic component 2.

The third exemplary embodiment of the invention was explained above based on the first exemplary embodiment, however, needless to say, the third exemplary embodiment can also be applied to the second exemplary embodiment.

Figure 14:
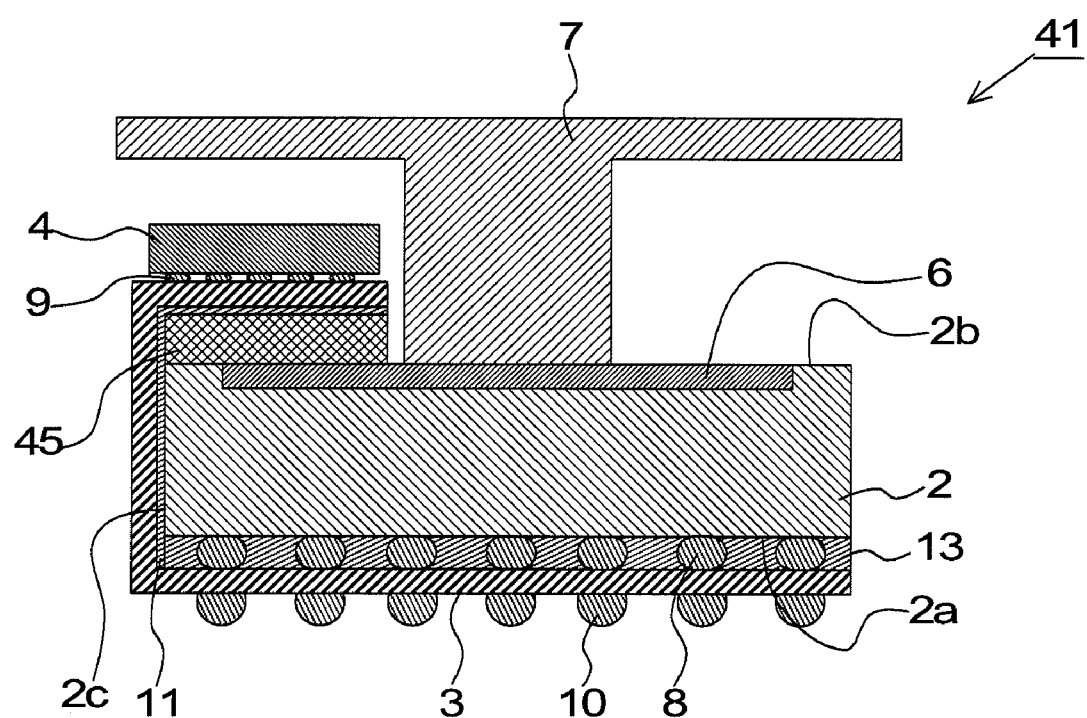
FIG. 14 is a schematic cross-sectional view of a device having electronic components mounted therein of a fourth exemplary embodiment of the present invention.

Next, a device having electronic components mounted therein of a fourth exemplary embodiment of the present invention will be explained. FIG. 14 shows a schematic cross-section view of a fourth exemplary embodiment of the present invention. In the first exemplary embodiment, the cross section of the spacer was L shaped so that it did not come in contact with the heat spreader 6, and a space 12 existed between the spacer and the heat spreader 6, however, in the device 41 having electronic components mounted therein of a fourth exemplary embodiment, the spacer 45 is secured to the second surface 2b of the first electronic component 2 that includes the surface of the heat spreader 6.

With this fourth exemplary embodiment, the spacer 45 comes in contact with the heat spreader 6, however, in this mode as well, it is possible to prevent direct heat transfer from the first electronic component 2 to the second electronic components 4. In addition, since the volume of the spacer 45 is greater than that of the spacer of the first exemplary embodiment, the heat capacity of the spacer 45 can be increased as well as the contact surface area with the first electronic component 2 is enlarged, so it is possible to increase the stability of the spacer 45 as a support.

Figure 15:
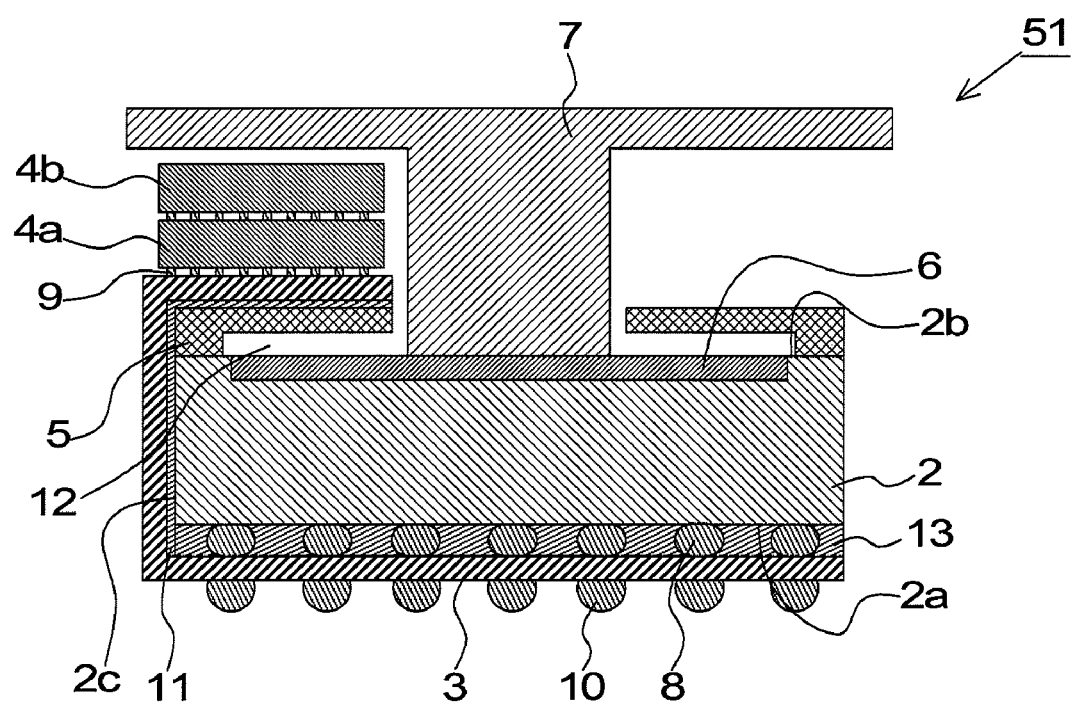
FIG. 15 is a schematic cross-sectional view of a device having electronic components mounted therein of a fifth exemplary embodiment of the present invention.

Next, a device having electronic components mounted therein of a fifth exemplary embodiment of the present invention is explained. FIG. 15 shows a schematic cross-section view of a fifth exemplary embodiment of the present invention. In the first through fourth exemplary embodiments, modes are shown in which a plurality of second electronic components are mounted along the second surface of a first electronic component (two-dimensional direction), however, as is shown in FIG. 15, in a fifth exemplary embodiment, a plurality of second electronic components 4a, 4b can be stacked and mounted (three-dimensional direction). With this exemplary embodiment, the three-dimensional space can be used more efficiently. This fifth exemplary embodiment was explained based on the first exemplary embodiment, however, needless to say, the fifth exemplary embodiment can also be applied to the second through fourth exemplary embodiments.

Figure 16:
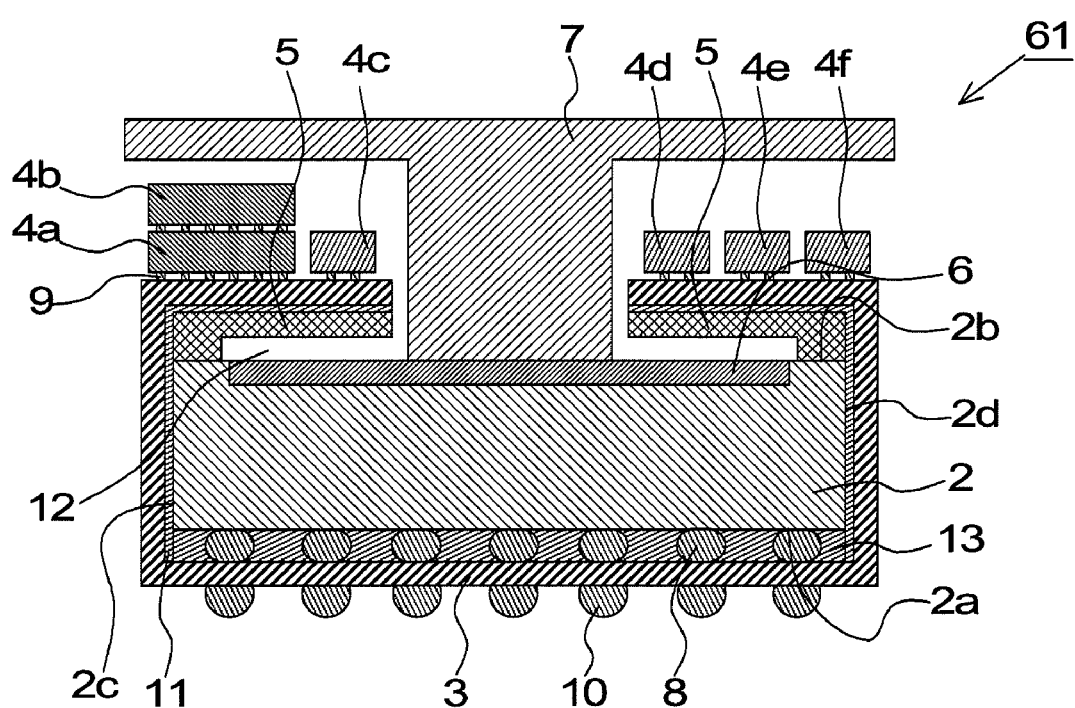
FIG. 16 is a schematic cross-sectional view of a device having electronic components mounted therein of a sixth exemplary embodiment of the present invention.
Figure 17:
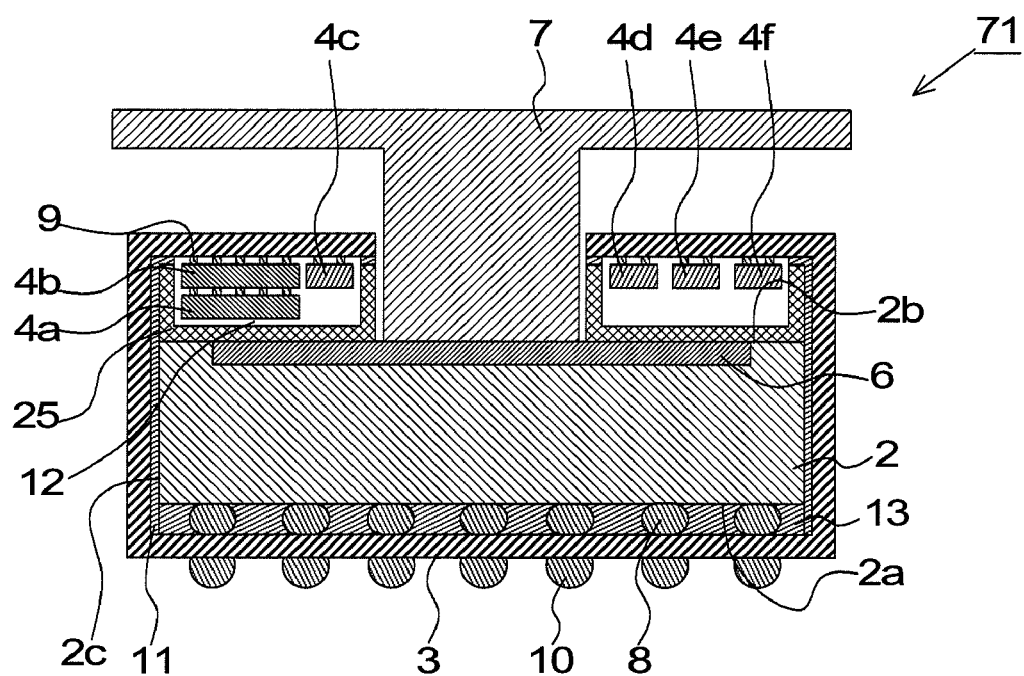
FIG. 17 is a schematic cross-sectional view of a device having electronic components mounted therein of a sixth exemplary embodiment of the present invention.

Next, a device having electronic components mounted therein of a sixth exemplary embodiment of the present invention will be explained. FIG. 16 and FIG. 17 show schematic cross-section views of a sixth exemplary embodiment of the present invention. In the first through fifth exemplary embodiments, modes are shown in which a plurality of the same kind of second electronic components are mounted above a first electronic component, however, as shown in FIG. 16 and FIG. 17, as a sixth exemplary embodiment, different kinds of second electronic components can be mounted above the first electronic component. For example, as in the mode shown in FIG. 16, semiconductor devices 4a, 4b and passive components 4c to 4f can be mounted above the first electronic component 2.

In the case, for example, where the first electronic component 2 is a CPU, decoupling capacitors for reducing switching noise such as an instantaneous voltage drop must be mounted around the CPU. With this sixth exemplary embodiment, by mounting decoupling capacitors such as the second electronic components 4c to 4f shown in FIG. 16, the mounting surface area of the decoupling capacitors can be reduced and the decoupling capacitors can be mounted even closer to the CPU, which is the first electronic component 2, so noise can be effectively reduced.

Moreover, as shown in FIG. 17, this sixth exemplary embodiment can also be applied to the device having electronic components mounted therein of the second exemplary embodiment. This sixth exemplary embodiment was explained based on the first through third and the fifth exemplary embodiments, however, needless to say, the sixth exemplary embodiment can also be applied to the fourth exemplary embodiment.

Figure 18:
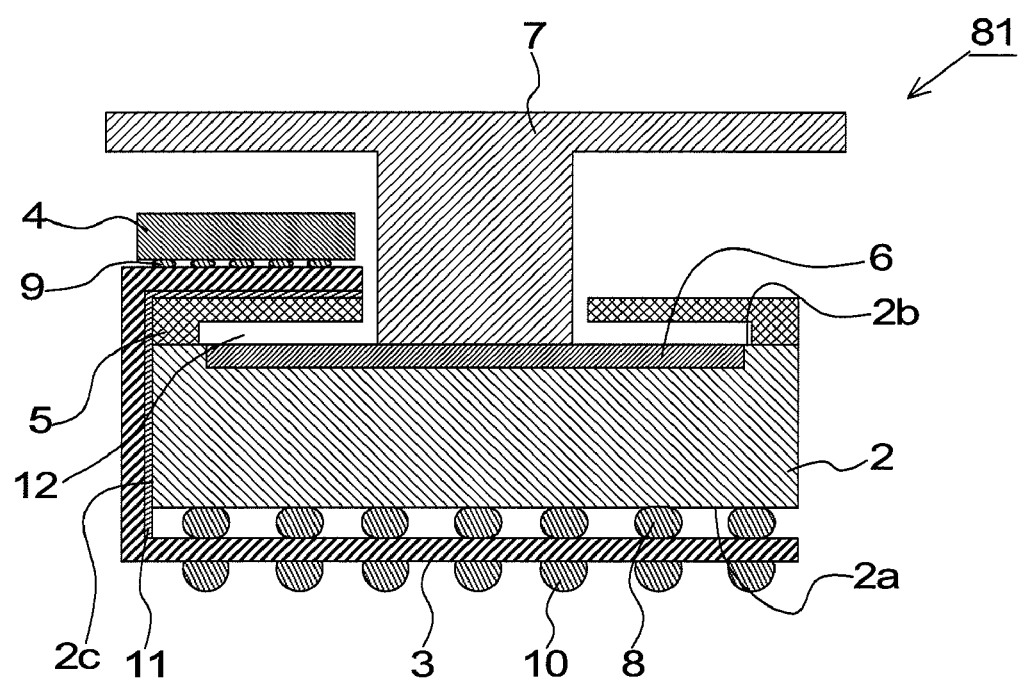
FIG. 18 is a schematic cross-sectional view of a device having electronic components mounted therein of a seventh exemplary embodiment of the present invention.

Next, a device having electronic components mounted therein of a seventh exemplary embodiment of the present invention will be explained. FIG. 18 shows a schematic cross-section view of a seventh exemplary embodiment of the present invention. In the first through sixth exemplary embodiments, modes are shown in which underfill resin 13 is filled between the first electronic component 2 and the flexible circuit board 3, however, as shown in FIG. 18, as an seventh exemplary embodiment, the device 81 having electronic components mounted therein can have the mode in which underfill resin is not used. The seventh exemplary embodiment was explained based on the first exemplary embodiment, however, needless to say, the seventh exemplary embodiment can also be applied to the second through sixth exemplary embodiments.

Example 1

The device having electronic components mounted therein of the first exemplary embodiment was manufactured so that the top surface had the mode shown in FIG. 11 and the cross-section through the center had the mode shown in FIG. 2.

In this example, one BGA (Ball Grid Array) type package (external dimensions: 38 mm×38 mm; power consumption: 7W; number of input/output terminals: approximately 800 pins) on which an image processing processor chip was installed was used as the first electronic component. Also, four DDR-DRAM packages (external dimensions: 10 mm×10 mm; number of input/output pins: approximately 60 pins) were used as the second electronic components.

The spacer used in this example was made of glass epoxy resin (FR4) having thermal conductivity of approximately 0.36 W/mK. The shape of the spacer is an inverted groove shape as shown in FIG. 2, the shape of the flat surface is as shown in FIG. 4, with the shape being such that when the image processing processor package is installed there is no contact with the heat spreader. In addition, the width of the space that is formed between the spacer and the image processing processor was 1 mm.

The flexible circuit board that was used in this example was a flexible circuit board on which a 12 μm thick copper foil pattern is formed on both surfaces of a 25 μm thick polyimide insulating layer. The copper foil patterns on both of these surfaces are connected by vias. Solder resist having a thickness of 10 μm is formed on both surfaces of the flexible circuit board with an openings formed only at locations where external terminals for installing BGA solder balls are formed, and 3 μm thick Ni film is formed by plating on the surfaces where the external terminals for installing the BGA solder balls are located, with 0.5 μm thick Au film similarly formed by plating thereon. A 25 μm thick thermoplastic polyimide resin sheet was applied to a designated portion on the surface where the image processing processor package is to be mounted (portion where the side surface of the image processing processor package and part of the spacer will be adhered to later). In the explanation of the manufacturing method shown in FIG. 6, adhesive is applied after the first electronic component and the flexible circuit board have been connected (see (c) of FIG. 6), however, in this example, an adhesive sheet was applied to the flexible circuit board beforehand.

The manufacturing method of this example is explained with reference to FIG. 6. First, a spacer was adhered to a first surface of an image processing processor package (surface on which the heat spreader will be installed) using an insulating adhesive (see (a) of FIG. 6). An epoxy type adhesive material, having high thermal resistance and whose adhesive strength will not degrade when the glass transition temperature is a high 140° C. or during heating in the reflow process, was used as this insulating adhesive.

Next, the image processing processor package and flexible circuit board were temporarily connected (adhered with flax) using a flip-chip mounter. This temporary connection was performed by first, securing the flexible circuit board on the stage of the flip-chip mounter by vacuum adsorption, then after applying flax to the external terminals of the flexible circuit board, aligning the BGA solder balls on the image processing processor package with the external terminals of the flexible circuit board using a camera that is equipped on the mounter, and applying a small load of approximately 100 g. Heat was not applied in the temporary connection process. After that, the product was removed from the flip-chip mounter, and by putting the product into a reflow furnace, the image processing processor package was connected to the flexible circuit board. Next, the flax was washed away using an organic solvent, and the product was dried (see (c) of FIG. 6).

Next, the product was placed on a heater stage and the flexible circuit board was bent along the side surface of the image processing processor package and spacer while heating the product at approximately 180° C. to adhere the flexible circuit board to the image processing processor package and spacer. By applying a pressure of approximately 1 MPa at the same time as heating, the flexible circuit board was then secured to the image processing processor package and spacer (see (d) of FIG. 6). The flexible circuit board was bent along two adjacent side surfaces of the image processing processor package to the first surface side of the image processing processor package so that is suspended over the first surface of the image processing processor as in the mode shown in FIG. 11.

After that, underfill resin comprising an epoxy type resin as the main component (does not contain a thermal conductive filler) was filled into the space between the image processing processor package and the flexible circuit board (around the BGA solder balls), after which the underfill resin was thermally set (see (e) of FIG. 6). Next, solder balls were formed on the external terminals on the surface of the flexible circuit board on the opposite side from the surface that faces the underfill resin by a ball transfer method and reflow process (see (f) of FIG. 6).

Flax was then applied to the external terminals of the flexible circuit board on the spacer that was bent above the image processing processor package, and similar to the image processing processor package, four DRAM packages were temporarily connected to the flexible circuit board using a flip-chip mounter. After that, the product was removed from the flip-chip mounter, and by placing the product into a reflow furnace, the DRAM packages were connected to the flexible circuit board, after which the flax was cleaned off using an organic solvent and the product is dried (see (g) of FIG. 6). Finally, a heat sink was adhered to the surface of the heat spreader of the image processing processor package using a conductive adhesive that includes Ag filler to complete the 3-dimensionally mounted semiconductor device (see (h) of FIG. 6).

In a device manufactured as described above having electronic components 3-dimensionally mounted therein, when the image processing processor package was operated, the surface temperature of the DRAM packages that are mounted on the flexible circuit board on the spacer was 60° C. to 70° C., so it was possible to keep the ambient temperature less than the rated operating temperature (80° C.) of the DRAM packages. Furthermore, by performing air cooling from the outside using a fan, it could be confirmed that the surface temperature of the DRAM packages could be dropped to 50° C. to 60° C. As a result, operation of an image processing module having four DRAM packages stacked above the image processing processor package could also be confirmed.

Figure 20:
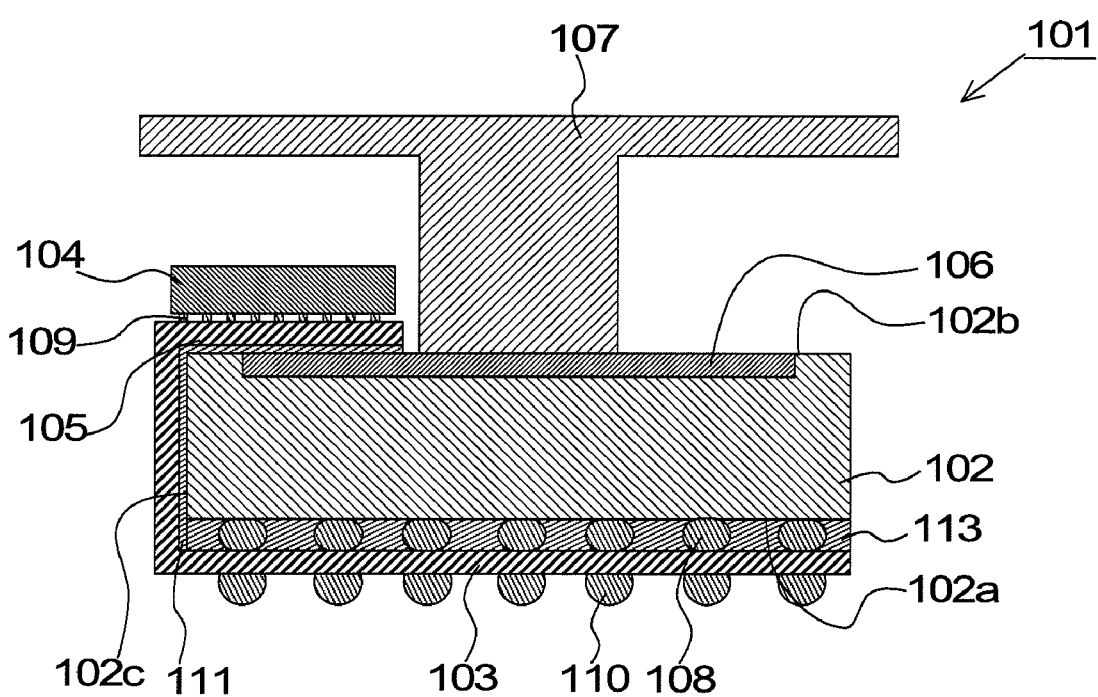
FIG. 20 is a schematic cross-sectional view of a comparison example in a first example and second example.
Figure 21:
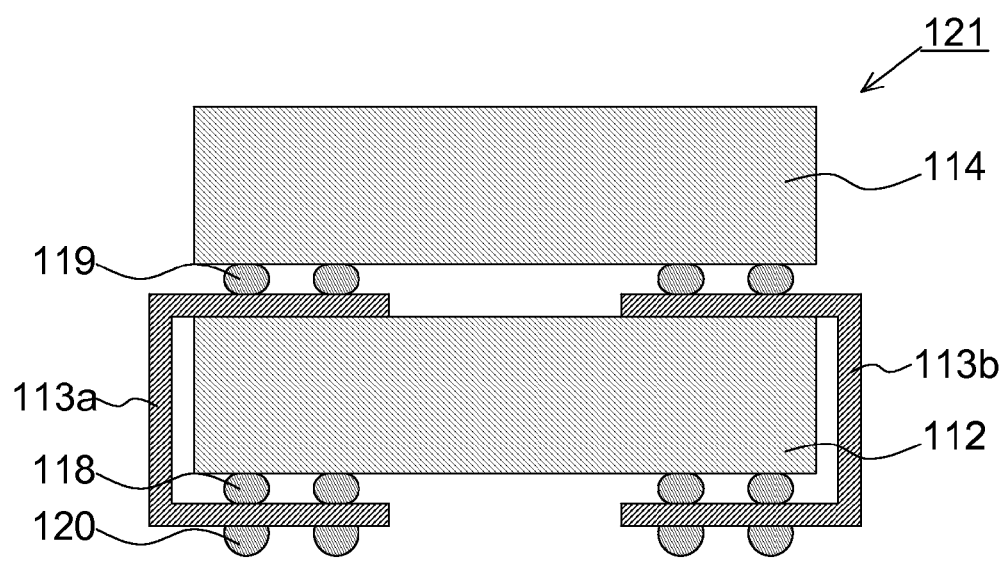
FIG. 21 is a schematic cross-sectional view of a 3-dimensionally mounted semiconductor device disclosed in patent document 1.
Figure 22:
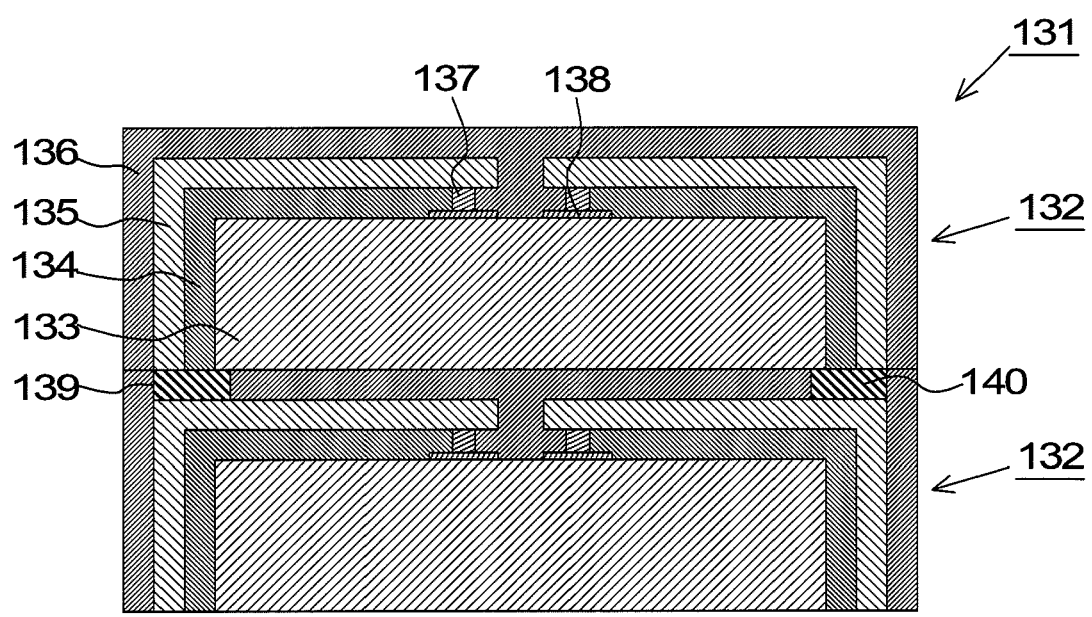
FIG. 22 is a schematic cross-sectional view of a 3-dimensional semiconductor device disclosed in patent document 2.

FIG. 20 is a schematic cross-section view of a device having electronic components mounted therein of a comparison example to this example. The device having electronic components mounted therein of this comparison example is the same as the device having electronic components mounted therein of the example except that a spacer is not used, and the flexible circuit board 103 is directly attached to the second surface 102b of the image processing processor package 102. In this comparison example, the flexible circuit board 103 comes in contact with the heat spreader 106 by approximately 70% of the area (surface area) that comes in contact with the second surface 102b of the image processing processor package 102. In the device having electronic components mounted therein of this comparison example, when the image processing processor package was operated, the surface temperature of the DRAM packages was 85° C. to 100° C.

From this comparison, the effect of a spacer suppressing a rise in temperature could be confirmed.

Moreover, by 3-dimensionally mounting four DRAM packages (total surface area of the four DRAM packages: 400 mm$^2$) above an image processing processor package, it was possible to reduce the mounting surface area, including the mounting surface of approximately 50 mm$^2$ that is the space between packages, approximately 450 mm$^2$ when compared with the conventional flat mounted type module construction.

Example 2

Figure 19:
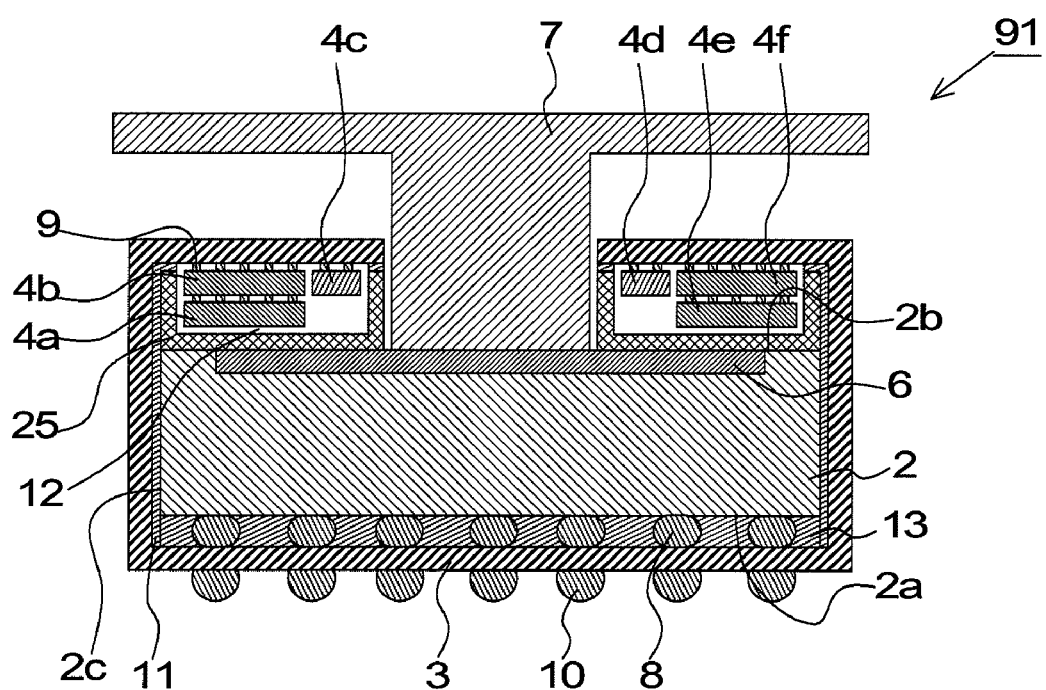
FIG. 19 is a schematic cross-sectional view of a device having electronic components mounted therein of a second example.

A device having electronic components mounted therein of a second exemplary embodiment whose cross section near the center has a mode as shown in FIG. 19 was manufactured.

In this example, one image processing processor package that was the same as that of example 1 was used as the first electronic component. In addition to eight DRAM packages that were the same as those of example 1, sixteen chip capacitors (so-called 1005 type: 1.0 mm×0.5 mm) having a capacitance of 100 pF were used as the second electronic components. The DRAM packages were stacked two each as shown in FIG. 19, so the DRAM packages formed 4 sets. A flexible circuit board that was the same as that of example 1 was used as the flexible circuit board.

The spacer that was used in this example was glass epoxy resin (FR4) having a thermal conductivity of 0.36 W/mK, and was formed beforehand by a machining process such that it has a groove section for accommodating the second electronic components. In addition, the space that is formed between the spacer and the image processing processor package was 1 mm.

The method for manufacturing this example is explained with reference to FIG. 8. First, the spacer was adhered to the installation surface of the heat spreader of the image processing processor package (see (a) of FIG. 8). This example differs from example 1 in that the spacer come in contact with both the exposed surface and non-exposed surface of the heat spreader. The adhesive used was the same as that of example 1.

Next, the image processing processor package, and the stacked DRAM packages (4 sets), in which two DRAM packages have been 3-dimensionally stacked in each set beforehand by a reflow method, were temporarily connected as in example 1 using a flip-chip mounter. A chip mounter was then used to temporarily connect the sixteen chip capacitors to the flexible circuit board using solder paste.

Next, the product was removed from the mounter, and by placing the product into a reflow furnace, the image processing processor package, stacked DRAM packages, and chip capacitors were connected with the FPC, after which the flax was cleaned away using an organic adhesive and the product was dried (see (c) of FIG. 8).

As in example 1, the sample was then placed onto a heater stage and the flexible circuit board is bent along the two opposing side surfaces of the image processing processor package and spacer to the first surface side of the image processing processor package while heating the sample at approximately 180° C. to suspend the flexible circuit board above the first surface of the image processing processor package. When doing this, the flexible circuit board and spacer were adhered together so that the stacked DRAM packages and chip capacitors were accommodated inside the groove section of the spacer (see (d) of FIG. 8). As shown in FIG. 9, in example 2, the flexible circuit board was bent from the opposing side surfaces of the image processing processor package.

Next, filling and thermal setting of underfill resin, formation of solder balls, and adhering of a heat sink were performed in the same way as in example 1 to complete the device having electronic components mounted 3-dimensionally therein (see (e) to (g) of FIG. 8).

In the device having electronic components mounted 3-dimensionally therein that was manufactured as described above, when the image processing processor package was operated, the surface temperature of the DRAM packages was 65° C. to 75° C., so it was possible to keep the temperature less than the rated operating temperature (80° C.) of the DRAM packages. Furthermore, by performing air cooling from the outside using a fan, it could be confirmed that the surface temperature of the DRAM packages could be dropped to 55° C. to 65° C.

As was explained in example 1, in construction with no spacer, the surface temperature of DRAM packages was 85° C. to 100° C., so the effect of a spacer suppressing a rise in temperature could be confirmed.

Moreover, with this example, operation as an image processing module having a total of eight DRAM packages stacked on the image processing processor package could also be confirmed. In addition, it was possible to double the memory capacity when compared with the device having electronic components mounted 3-dimensionally therein of example 1. Furthermore, by 3-dimensionally mounting eight DRAM packages (total DRAM package surface area: 800 mm$^2$) on the image processing processor package, it was possible to reduce the mounted surface area, including the mounting area of approximately 100 mm$^2$ that is the space between packages, 900 mm$^2$ more than conventional module construction on which a single DRAM package is mounted. Also, by mounting capacitors near the DRAM packages it was possible to reduce the switching noise more than with the device having electronic components mounted 3-dimensionally therein of example 1.

In the manufacturing method of example 2, what required putting an image processing processor, which is typically vulnerable to heat, through a reflow process 3 times with example 1, only required 2 times with example 2, so a higher mounting yield than that of example 1 was possible.

The semiconductor device of the present invention was explained based on the exemplary embodiments and examples described above, however, the invention is not limited to these exemplary embodiments and needless to say can include various variations, modifications and improvements of the aforementioned exemplary embodiments and examples within the scope and fundamental technical idea of the present invention. Moreover, various combinations, substitutions, or selections of the various disclosed elements are possible within the scope of the claims of the invention.

Any additional problems, objectives and modes of the invention are made clear from the entire disclosure, including the claims.

INDUSTRIAL APPLICABILITY

In the present invention, various components can be used as electronic components, for example, semiconductor devices such as a CPU, application processor, memory (DRAM, flash memory, SRAM, and the like) or passive components such as capacitors, resistors, inductors, and the like can be used. The present invention is particularly applied to modes that use a semiconductor device that generates a large amount of heat such as a CPU or application processor as a first electronic component.

The device having electronic components mounted therein of the present invention can, for example, be mounted on a motherboard (circuit board), or module board. By doing so, the invention can be applied to mobile equipment such as mobile telephones or the like, or to various kinds of electronic equipment such as personal computers, car navigation equipment, in-car modules, game devices and the like, making it possible for electronic equipment to be more compact, lower cost and have higher performance.

The invention claimed is:

1. A device having electronic components mounted therein comprising:
   a first electronic component having an external terminal(s) on a first surface and a heat spreader on a second surface;
   at least one second electronic component that is located in the direction of said second surface of said first electronic component;
   a flexible circuit board that is electrically connected to said external terminal of said first electronic component and at least one said second electronic component, at least a part of said flexible circuit to which at least one said second electronic component is connected being located on said second surface side of said first electronic component; and
   a spacer that prevents direct heat transfer between at least part of said flexible circuit board and said second surface of said first electronic component.

2. The device having electronic components mounted therein of claim 1, wherein
   said spacer provides a specified space between at least said part of said flexible circuit board and said second surface of said first electronic component.

3. The device having electronic components mounted therein of claim 1, wherein
   said spacer is secured to a portion of said second surface of said first electronic component other than the surface of said heat spreader.

4. The device having electronic components mounted therein of claim 1, wherein
   a portion of said spacer on which at least said one second electronic component is installed extends through a specified space between the portion of said spacer and said heat spreader so that the portion of said spacer does not come in contact with said heat spreader.

5. The device having electronic components mounted therein of claim 4, wherein
   said spacer has a shape such that said spacer covers said second surface of said first electronic component in an area other than the area where the heat sink is mounted on said heat spreader, and
   said spacer and first electronic component form an opening for allowing air in said space to circulate.

6. The device having electronic components mounted therein of claim 1, wherein
   said spacer is formed from at least one of glass, a resin and ceramic.

7. The device having electronic components mounted therein of claim 1, wherein
   said spacer has a thermal conductivity of 1 W/mK or less.

8. The device having electronic components mounted therein of claim 1, wherein
   said first electronic component and said second electronic component are connected to different surfaces of said flexible circuit board.

9. The device having electronic components mounted therein of claim 1, wherein
   said spacer has a concave section or groove section, and
   at least one said second electronic component is accommodated inside said concave section or groove section.

10. The device having electronic components mounted therein of claim 9, wherein
    at least one said second electronic component does not come in contact with said spacer.

11. The device having electronic components mounted therein of claim 9, wherein
    said first electronic component and said second electronic component are connected on the same surface of said flexible circuit board.

12. The device having electronic components mounted therein of claim 1, wherein
    said first electronic component is an electronic component that includes a semiconductor element, and
    at least one said second electronic component is an electronic component that includes a semiconductor element or is a passive element.

13. The device having electronic components mounted therein of claim 1, wherein
    said flexible circuit board is adhered to at least one of said first electronic component and said spacer with an adhesive, and
    said adhesive is a thermoplastic resin or a thermal setting resin before setting.

14. A manufacturing method for a device having electronic components mounted therein comprising:
    installing a spacer on a second surface of a first electronic component which has an external terminal(s) on a first surface and a heat spreader on said second surface, said spacer preventing direct heat transfer between at least a part of a flexible circuit board that is located above said second surface and said second surface;
    electrically connecting said external terminal and said flexible circuit board, and bending said flexible circuit board such that part of said flexible circuit board is located above said spacer; and
    electrically connecting a second electronic component to the portion of said flexible circuit board that is above said spacer.

15. A manufacturing method for a device having electronic components mounted therein comprising:
    installing a spacer on a second surface of a first electronic component, which has an external terminal(s) on a first surface and a heat spreader on said second surface, said spacer preventing direct heat transfer between at least a part of a flexible circuit board that is located above said second surface and said second surface;
    electrically connecting said external terminals and said flexible circuit board, and electrically connecting a second electronic component and said flexible circuit board; and
    bending said flexible circuit board such that said second electronic component is located above said spacer.

* * * * *